United States Patent
Park et al.

(10) Patent No.: US 7,927,902 B2
(45) Date of Patent: Apr. 19, 2011

(54) METHODS OF FABRICATING IMAGE SENSORS AND IMAGE SENSORS FABRICATED THEREBY

(75) Inventors: Won-je Park, Yongin-si (KR); Chan Park, Yongin-si (KR); Young-hoon Park, Suwon-si (KR); Jae-ho Song, Suwon-si (KR); Jong-wook Hong, Seoul (KR); Keo-sung Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 488 days.

(21) Appl. No.: 11/798,704

(22) Filed: May 16, 2007

(65) Prior Publication Data

US 2007/0267666 A1    Nov. 22, 2007

(30) Foreign Application Priority Data

May 17, 2006    (KR) .................. 10-2006-0044372

(51) Int. Cl.
*H01L 21/00* (2006.01)
(52) U.S. Cl. ................. 438/48; 438/144; 257/E27.133
(58) Field of Classification Search .............. 438/48, 438/144; 257/E27.133, E27.134
See application file for complete search history.

(56) References Cited

U.S. PATENT DOCUMENTS

| 6,306,676 | B1 | 10/2001 | Stevens et al. | |
| 2001/0055849 | A1* | 12/2001 | Pan et al. ................. | 438/286 |
| 2002/0197758 | A1* | 12/2002 | Chen et al. ................ | 438/48 |
| 2005/0001248 | A1* | 1/2005 | Rhodes ..................... | 257/292 |
| 2005/0088556 | A1* | 4/2005 | Han ......................... | 348/308 |
| 2005/0255641 | A1* | 11/2005 | Sugihara ................... | 438/180 |
| 2006/0284274 | A1* | 12/2006 | Lee et al. .................. | 257/431 |

FOREIGN PATENT DOCUMENTS

| JP | 2003-264279 | 9/2003 |
| KR | 1020050018512 | 2/2005 |

* cited by examiner

*Primary Examiner* — Evan Pert
*Assistant Examiner* — Selim Ahmed
(74) *Attorney, Agent, or Firm* — Harness, Dickey & Pierce, P.L.C.

(57) ABSTRACT

A method of fabricating an image sensor may include providing a substrate including light-receiving and non-light-receiving regions; forming a plurality of gates on the non-light-receiving region; ion-implanting a first-conductivity-type dopant into the light-receiving region to form a first dopant region of a pinned photodiode; primarily ion-implanting a second-conductivity-type dopant, different from the first-conductivity-type dopant, into an entire surface of the substrate, using the gates as a first mask; forming spacers on both side walls of the gates; and secondarily ion-implanting the second-conductivity-type dopant into the entire surface of the substrate, using the plurality of gates including the spacers as a second mask, to complete a second dopant region of the pinned photodiode. An image sensor may include the substrate; a transfer gate formed on the non-light-receiving region; a first dopant region in the light-receiving region; and a second dopant region formed on a surface of the light-receiving region.

13 Claims, 16 Drawing Sheets

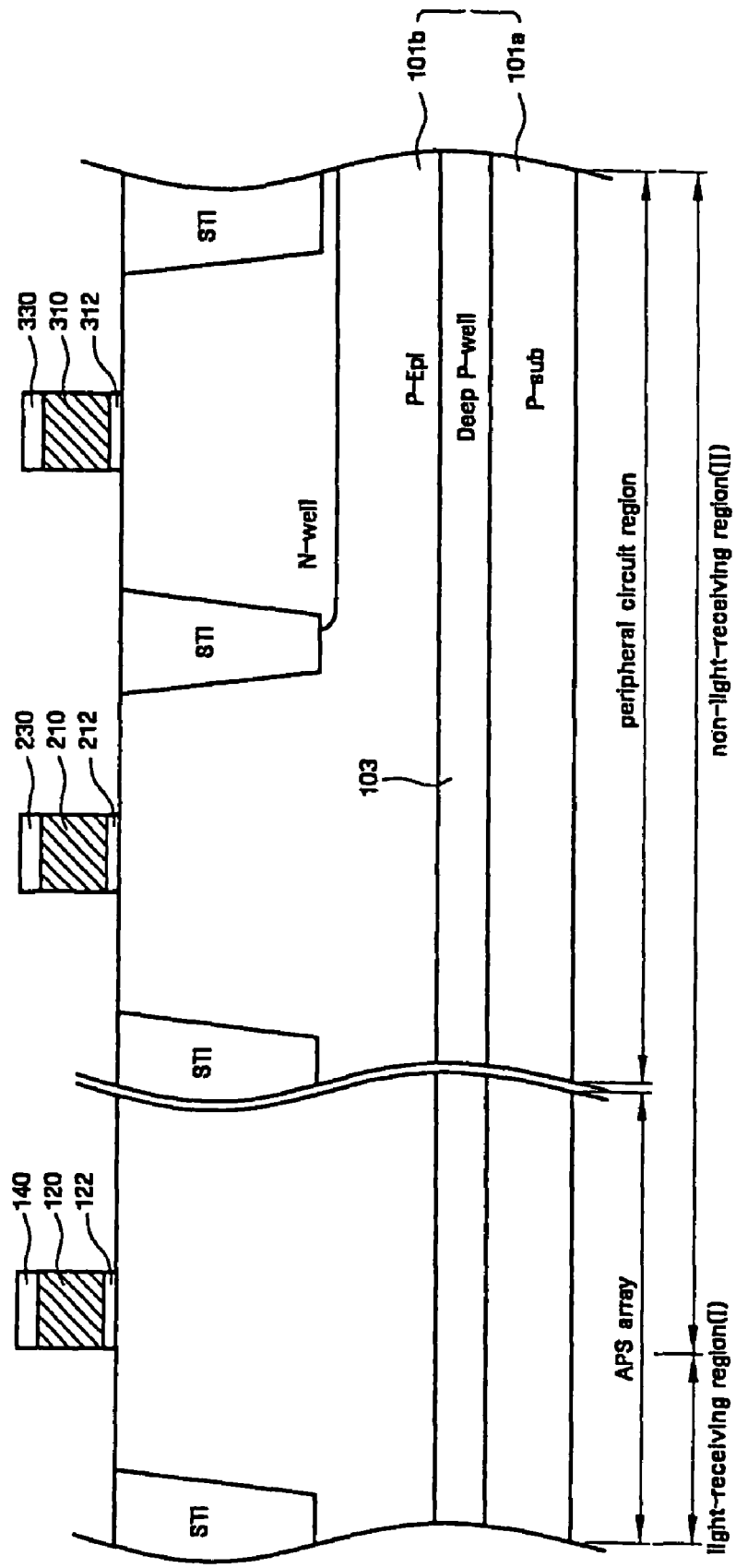

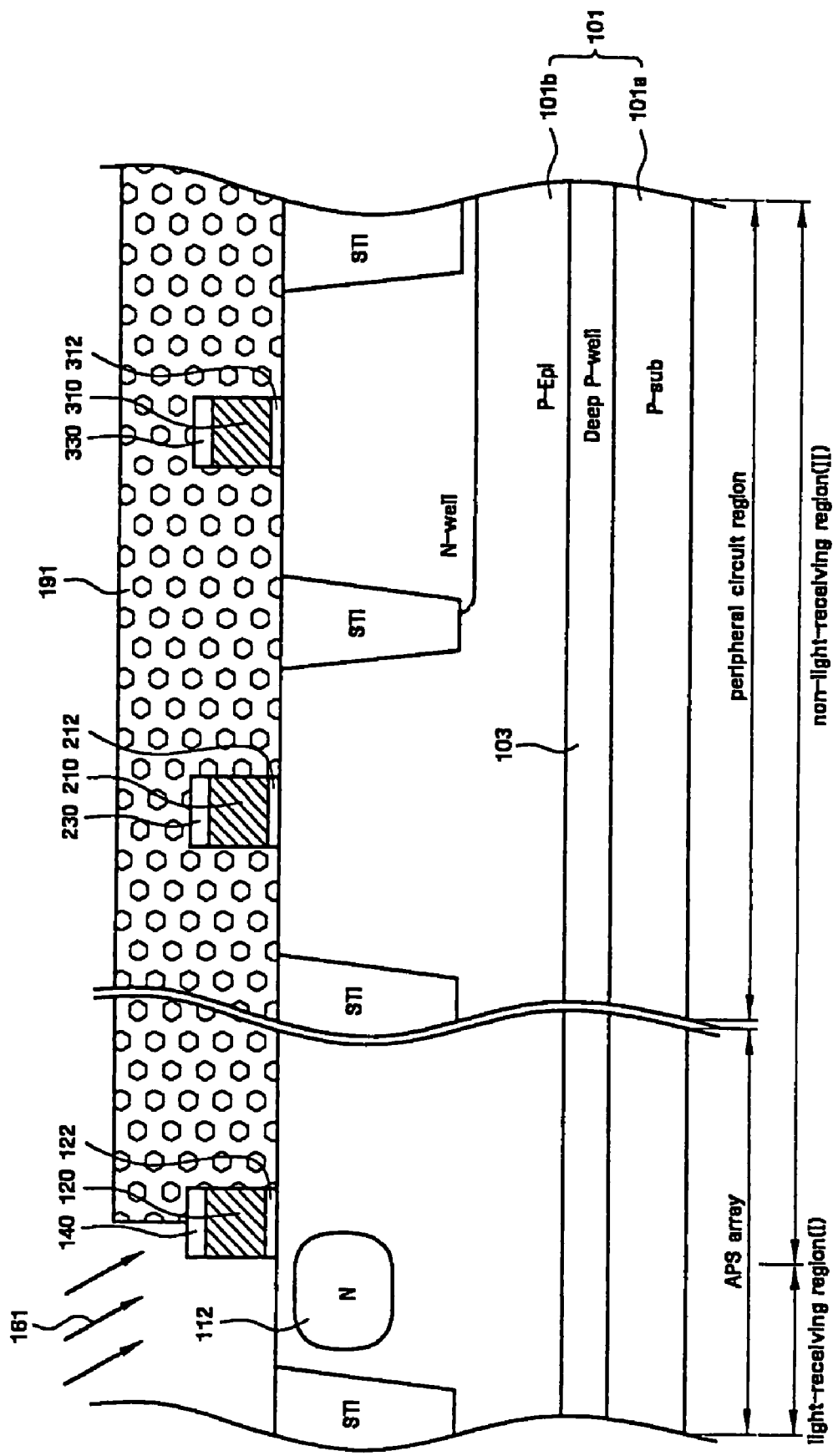

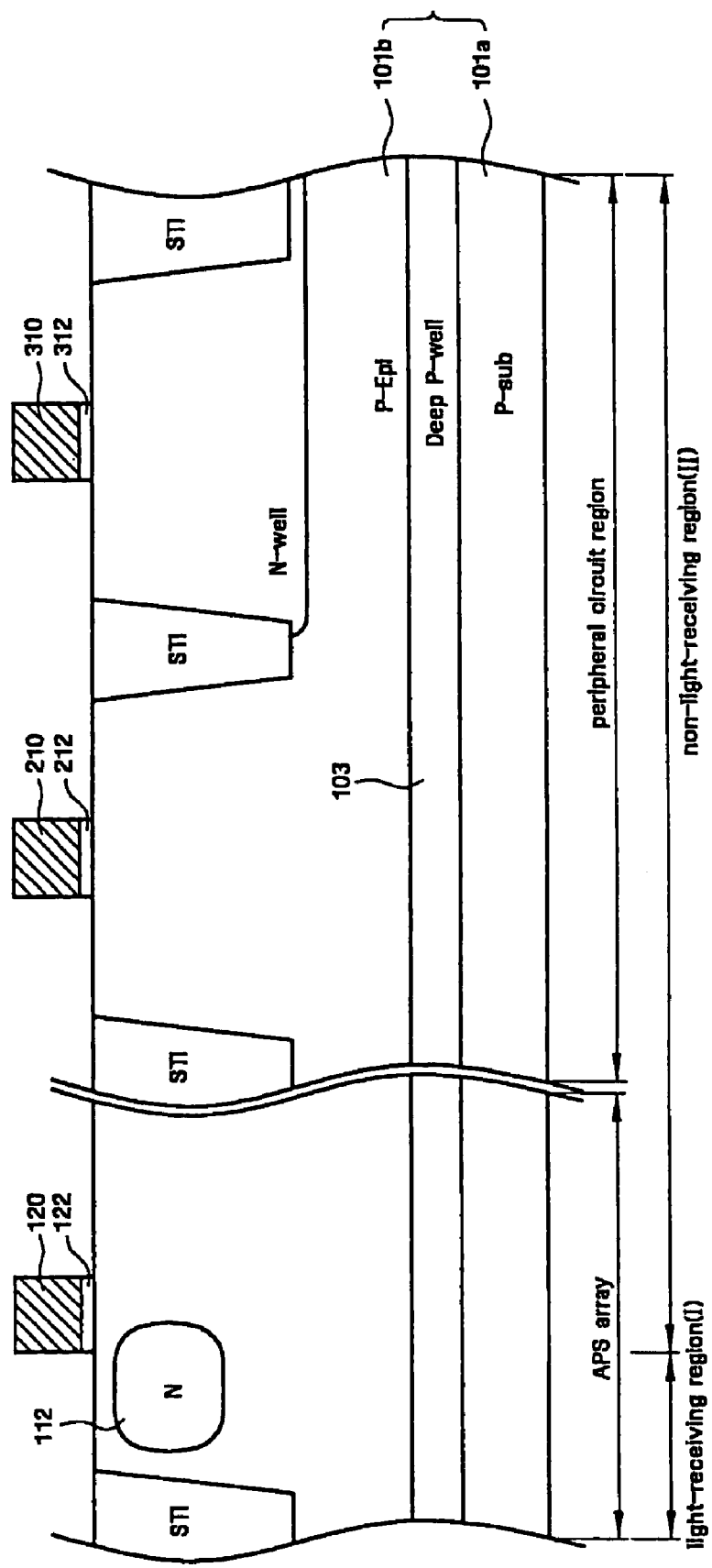

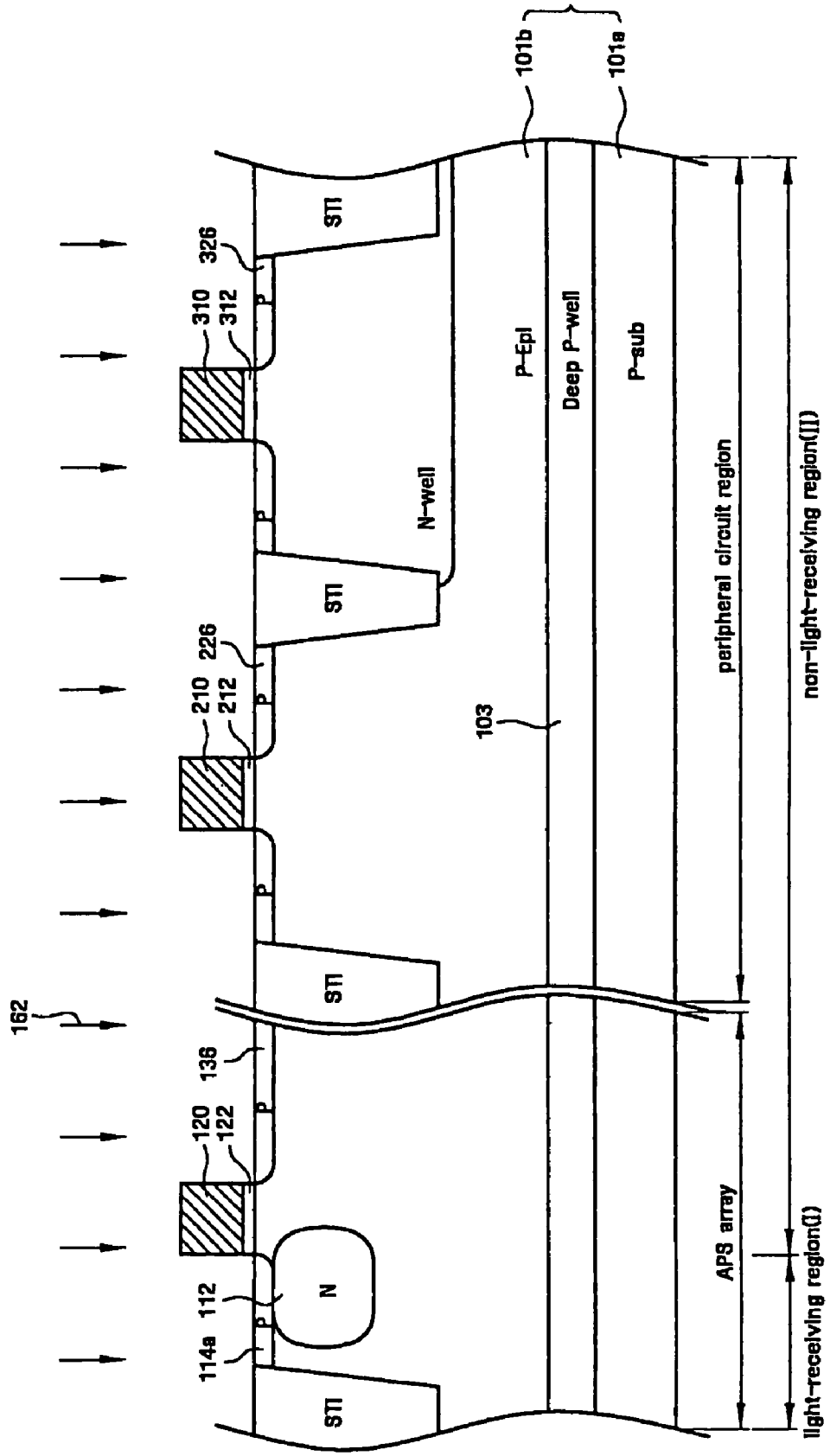

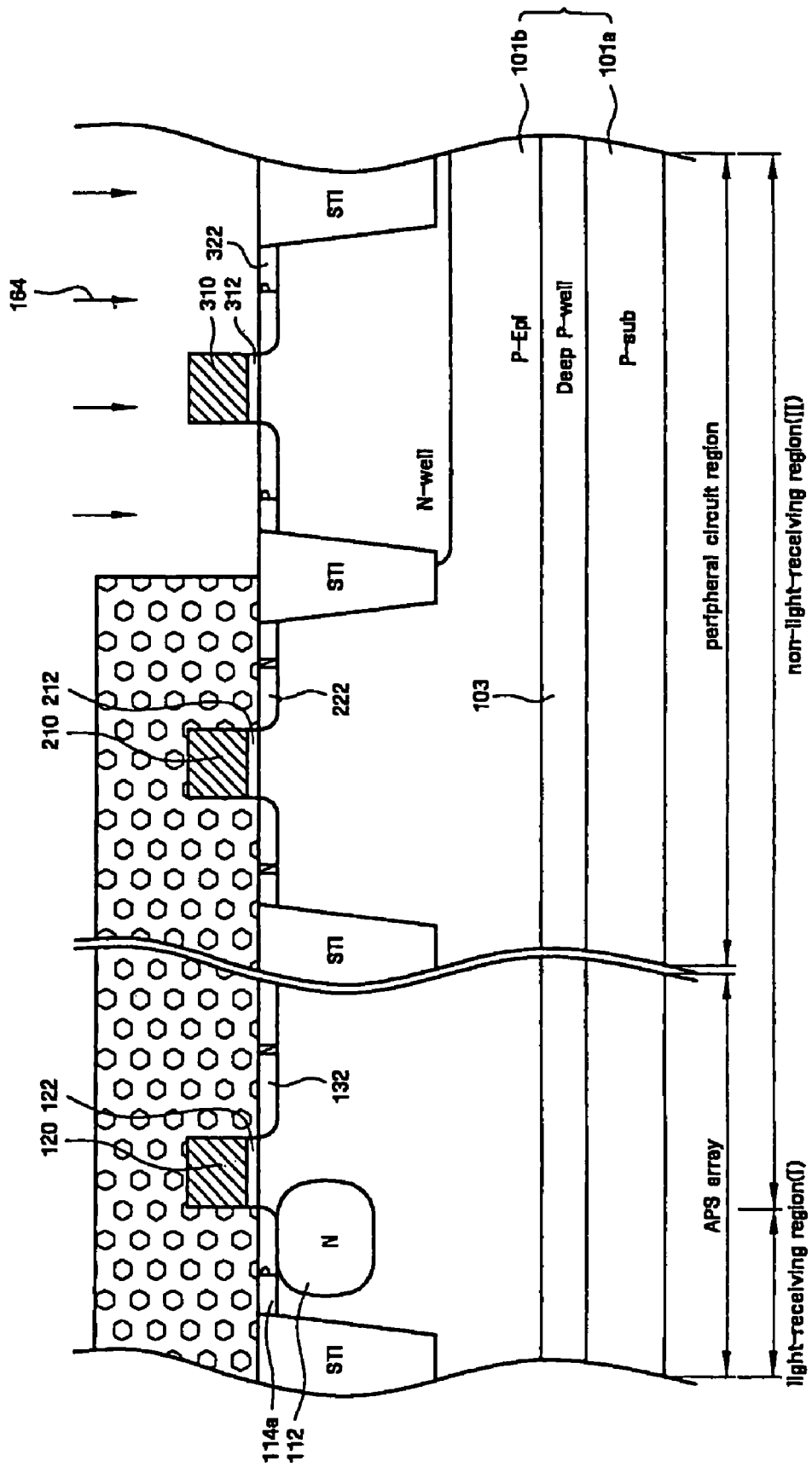

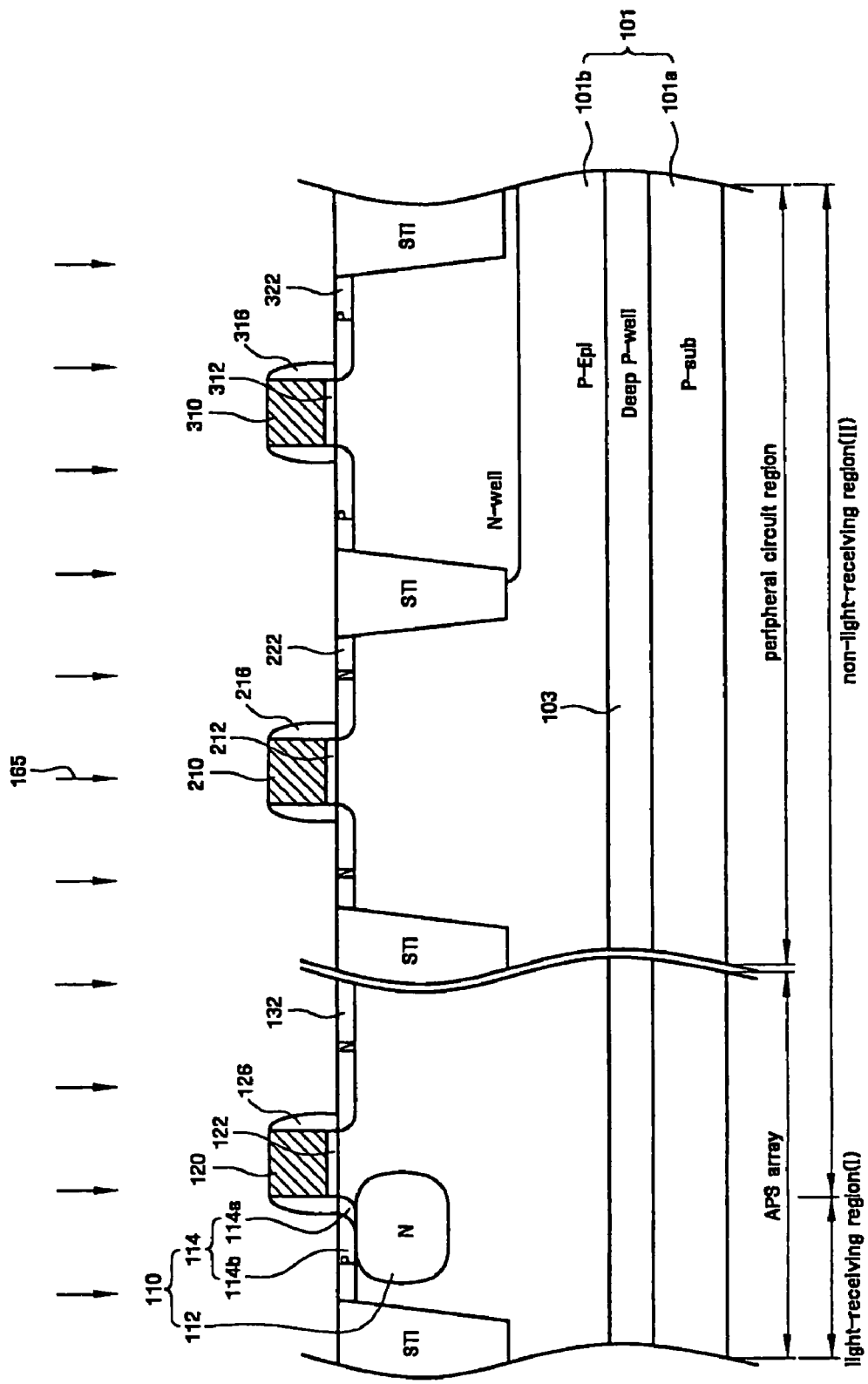

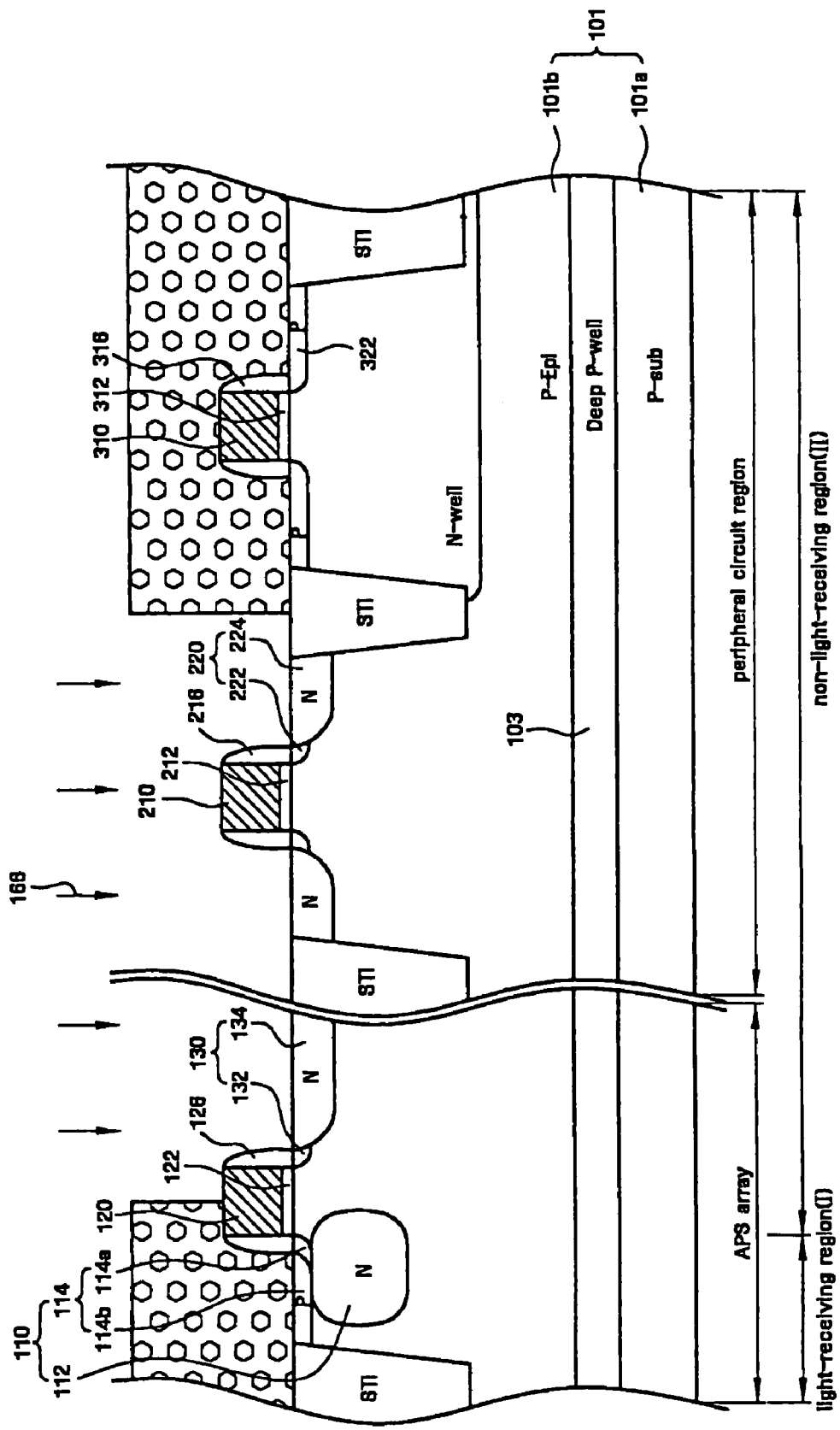

METHODS OF FABRICATING IMAGE SENSORS AND IMAGE SENSORS FABRICATED THEREBY

PRIORITY STATEMENT

This application claims priority from Korean Patent Application No. 10-2006-0044372, filed on May 17, 2006, in the Korean Intellectual Property Office (KIPO), the entire contents of which are incorporated herein by reference.

BACKGROUND

1. Field

Example embodiments relate to methods of fabricating image sensors and image sensors fabricated by the methods. Also, example embodiments relate to methods of fabricating image sensors and image sensors fabricated by the methods in which the number of masks required to fabricate the image sensors may be decreased.

2. Description of Related Art

Typically, an image sensor functions to convert an optical image to an electrical signal. With the recent developments in computer industries and communication industries, the demand for image sensors having improved performance is increasing in various fields, including those of digital cameras, camcorders, PCS (Personal Communication Systems), game kits, guard cameras, medical micro cameras, robots, etc.

In particular, a metal-oxide semiconductor (MOS) image sensor having a simple driving process may be realized through various scanning manners. Further, since a signal processing circuit is integrated in a single chip, the size of a product may be decreased and the cost of fabricating such a sensor may be reduced due to the compatible MOS process technology. Furthermore, the MOS image sensor has very low power consumption, and therefore can be applied to a product having a limited battery capacity. Accordingly, the use of the MOS image sensor is drastically increasing, owing to the technological development thereof and the ability to realize high resolution.

In such an MOS image sensor, a light-receiving element is exemplified by a pinned photodiode (PPD) including an n-type dopant region formed in the substrate and a p-type dopant region formed on the surface of the substrate. Here, the n-type dopant region functions as a potential well for accumulating a charge corresponding to the amount of incident light to be absorbed, while the p-type dopant region functions as a potential barrier preventing the flow of the charge, generated by defects on the surface of the substrate, into the n-type dopant region.

However, according to a conventional image sensor fabrication method, since an additional mask is required to form the p-type dopant region, it is necessary to perform a plurality of additional processes including the application of a photoresist film, photolithography, and removal of the photoresist film.

SUMMARY

Example embodiments may provide methods of fabricating image sensors in which the number of masks required to fabricate the image sensors may be decreased.

Example embodiments also may provide image sensors fabricated using the methods.

According to example embodiments, a method of fabricating an image sensor may include: providing a substrate including a light-receiving region and a non-light-receiving region; forming a plurality of gates on the non-light-receiving region; ion-implanting a first-conductivity-type dopant into the light-receiving region to form a first dopant region of a pinned photodiode; primarily ion-implanting a second-conductivity-type dopant, different from the first-conductivity-type dopant, into an entire surface of the substrate, using the plurality of gates as a first mask; forming spacers on both side walls of the plurality of gates; and secondarily ion-implanting the second-conductivity-type dopant into the entire surface of the substrate, using the plurality of gates including the spacers as a second mask, to complete a second dopant region of the pinned photodiode.

According to example embodiments, an image sensor may include: a substrate including a light-receiving region and a non-light-receiving region defined in the substrate; a transfer gate formed on the non-light-receiving region and spacers formed on both side walls of the transfer gate; an n-type first dopant region of a pinned photodiode formed in the light-receiving region; and a p-type second dopant region of the pinned photodiode formed on a surface of the light-receiving region. The second dopant region of the pinned photodiode may include: a low-concentration dopant region formed to be aligned to the transfer gate; and a higher-concentration dopant region formed to be aligned to the spacer.

BRIEF DESCRIPTION OF THE DRAWINGS

The above and/or other aspects and advantages will become more apparent and more readily appreciated from the following detailed description of example embodiments taken in conjunction with the accompanying drawings, in which:

FIGS. 5A to 5I are cross-sectional views schematically showing a process of fabricating the image sensor according to an example embodiment;

DETAILED DESCRIPTION OF EXAMPLE EMBODIMENTS

Figure 1:
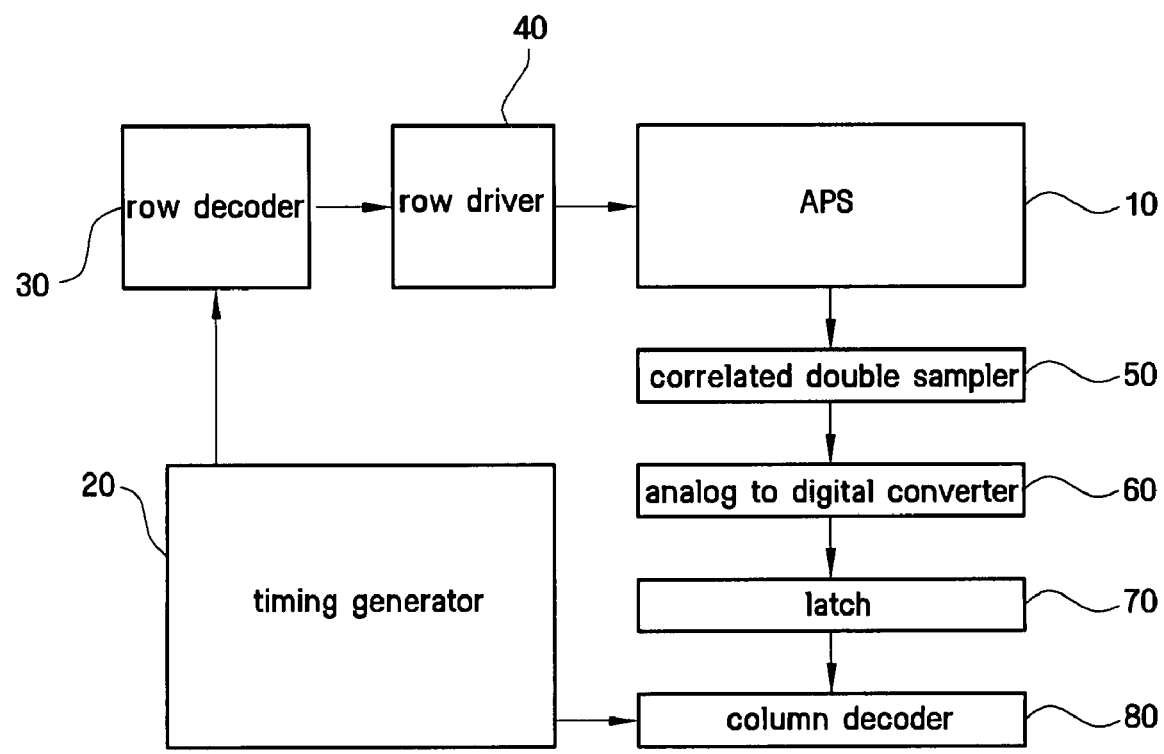
FIG. 1 is a block diagram showing an image sensor according to an example embodiment.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," or "coupled to" to another component, it may be directly on, connected to, or coupled to the other component or intervening components may be present. In contrast, when a component is referred to as being "directly on," "directly connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

In example embodiments, the image sensor may be, for example, a complimentary metal-oxide semiconductor (CMOS) image sensor. However, the image sensor of example embodiments may include any image sensor resulting from the use of a CMOS process, including a negative-channel metal-oxide semiconductor (NMOS) process, a positive-channel metal-oxide semiconductor (PMOS) process, or both NMOS and PMOS processes.

FIG. 1 is a block diagram showing the image sensor according to an example embodiment.

As shown in FIG. 1, the image sensor of example embodiments may include a APS array 10 composed of two-dimensionally arranged pixels each having a light-receiving element, and a peripheral circuit region for operating the APS array 10. As such, the peripheral circuit region may include a timing generator 20, a row decoder 30, a row driver 40, a correlated double sampler (CDS) 50, an analog-to-digital converter (ADC) 60, a latch 70, and/or a column decoder 80.

The APS array 10 may include a plurality of pixels that are two-dimensionally arranged. In the APS array 10 of example embodiments, a 4-shared pixel structure, in which four light-receiving elements share a reading element with one another, may be arranged as a repeating unit in a matrix form. When the area that has been occupied by reading elements is decreased by the use of the 4-shared pixel structure, the size of the light-receiving elements may be increased by as much as the decrease in area, thus increasing light-receiving efficiency and improving light intensity and saturation signal level. However, example embodiments are not limited to such a 4-shared pixel structure.

The 4-shared pixel structure may function to convert an optical image to an electrical signal. The APS array 10 may be driven in response to a plurality of driving signals (including a pixel selection signal SEL, a reset signal RX, and/or a charge-transfer signal TX) that may be received from the row driver 40. Further, the electrical signal may be supplied from the APS array 10 to the CDS 50 via a vertical signal line.

The timing generator 20 may function to supply a timing signal and a control signal to the row decoder 30, and to supply a timing signal and a control signal to the column decoder 80. The timing signal supplied to the row decoder 30 may be different than or the same as the timing signal supplied to the column decoder 80. Similarly, the control signal supplied to the row decoder 30 may be different than or the same as the control signal supplied to the column decoder 80.

The row driver 40 may function to supply the plurality of driving signals for driving a plurality of unit pixels, depending on the decoded result using the row decoder 30, to the APS array 10. In the case where the unit pixels are arranged in a matrix form, the driving signal may be provided on every row.

The CDS 50 may receive the electrical signal from the APS array 10 via the vertical signal line in order to hold the electrical signal and to sample it. That is, a predetermined noise level and signal level caused by the electrical signal may be double sampled, after which the difference level between the noise level and the signal level may be output.

The ADC 60 may function to convert the analog signal corresponding to the difference level into a digital signal, which then may be output.

The latch 70 may function to latch the digital signal so as to subsequently output the latched signal to an image signal processor (not shown), depending on the decoded result using the column decoder 80.

Figure 2:
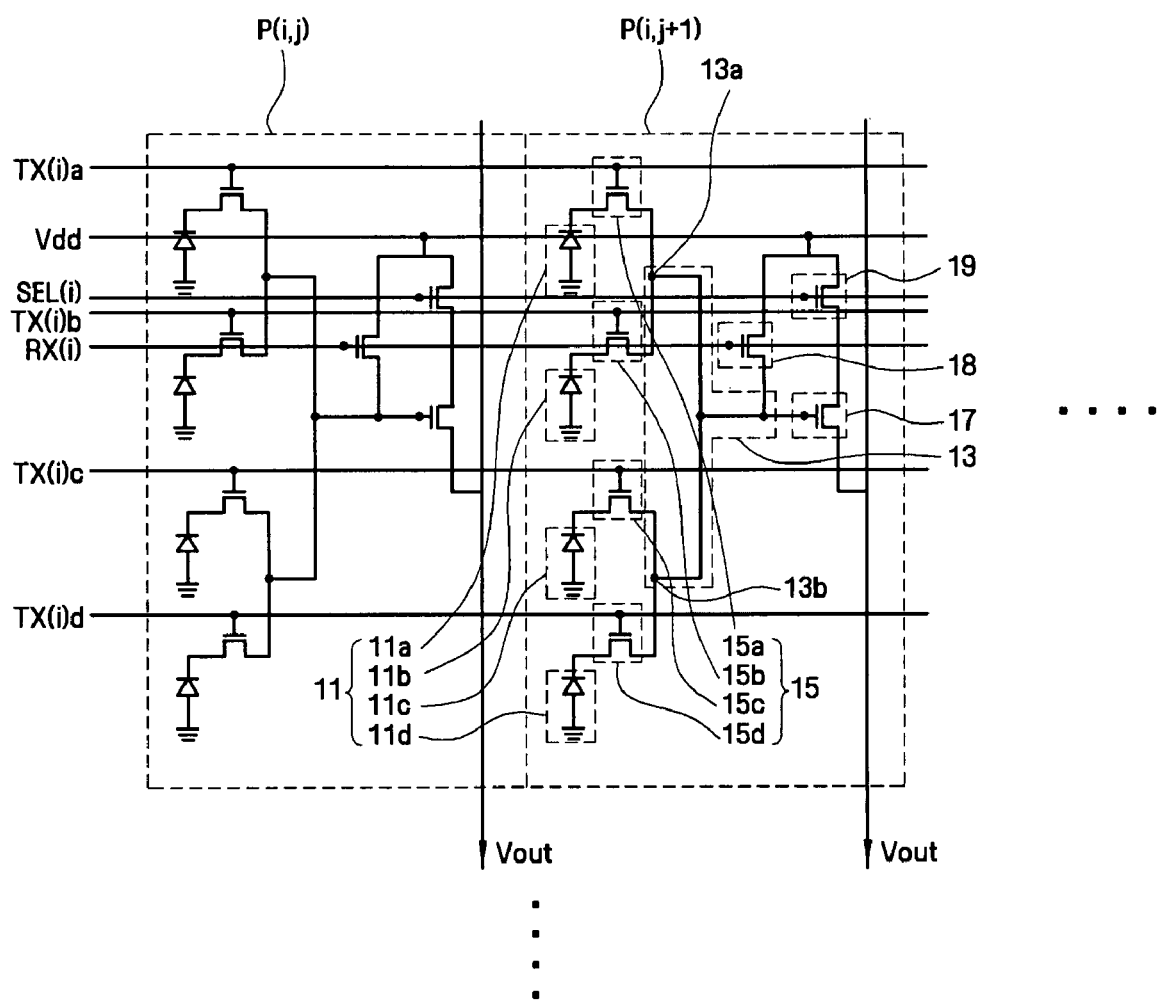
FIG. 2 is an equivalent circuit diagram showing an active pixel sensor (APS) array in the image sensor of an example embodiment.

FIG. 2 is an equivalent circuit diagram of the APS array 10 of the image sensor, according to an example embodiment.

With reference to FIG. 2, the 4-shared pixel structure P may be arranged in a matrix form, thus forming the APS array 10 (i.e., FIG. 1). In the 4-shared pixel structure P, the four light-receiving elements share the reading element with one another. The reading element of example embodiments may be used to read a light signal supplied to the light-receiving elements, and may include, for example, a drive element, a reset element, and/or a select element.

For example, the 4-shared pixel structure P may include four light-receiving elements 11a, 11b, 11c, 11d. The light-receiving elements 11a, 11b, 11c, 11d may function to absorb incident light so as to accumulate a charge corresponding to the amount of such light. In example embodiments, the light-receiving elements 11a, 11b, 11c, 11d may be, for example, PPDs.

The respective light-receiving elements 11a, 11b, 11c, 11d maybe electrically connected to charge-transfer elements 15a, 15b, 15c, 15d for transferring the accumulated charge to floating diffusion regions (FDs) 13a, 13b. Since the FDs 13a, 13b, which are used to convert the charge into voltage, have parasitic capacitance, the charge is cumulatively stored.

In the 4-shared pixel structure P, the four light-receiving elements 11a, 11b, 11c, 11d share the reading element, that is, the drive element 17, the reset element 18, and/or the select element 19, with one another. The functions thereof are described below based on the i-row pixels (P(i,j), P(i,j+1), . . . ).

The drive element 17, exemplified by a source-follower amplifier, acts to amplify the change of electrical potential of the FD 13 which receives the charge accumulated in the light-receiving elements 11a, 11b, 11c, 11d and then to output it to an output line Vout.

The reset element 18 may function to reset the FD 13. Such resets may or may not be periodic. The reset element 18 may include a single MOS transistor that is driven by bias provided through a reset line RX(i) for applying bias. The bias may or may not be predetermined. When the reset element 18 is turned on by the bias provided through the reset line RX(i), electric potential (that may or may not be predetermined), for example, power voltage Vdd, electrically connected to the drain of the reset element 18, may be transferred to the FD 13.

The select element 19 functions to select the 4-shared pixel structure P to be read in a row unit. The select element 19 may consist of a single MOS transistor, which is driven by bias provided through a row select line SEL(i). When the select element 19 is turned on by the bias provided through the row select line SEL(i), electric potential (that may or may not be predetermined), for example, power voltage Vdd, electrically connected to the drain region of the select element 19, may be transferred to the drain region of the drive element 17.

The transfer lines TX(i)a, TX(i)b, TX(i)c, TX(i)d for applying the bias to the charge-transfer elements 15a, 15b, 15c, 15d, the reset line RX(i) for applying the bias to the reset element 18, and/or the row select line SEL(i) for applying the bias to the select element 19 may be extended parallel to one another in the row direction to arrange them.

Figure 3:
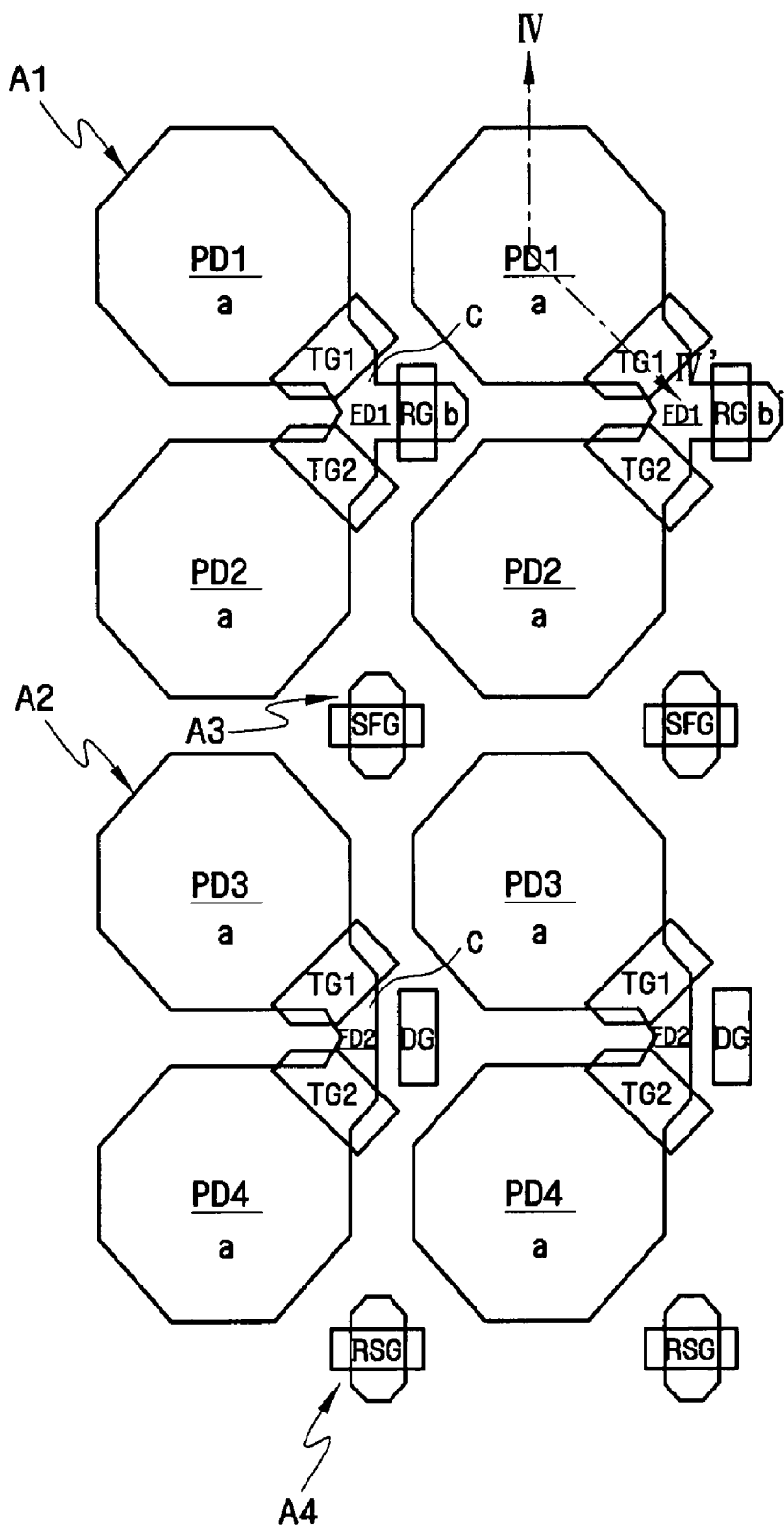
FIG. 3 is a layout showing the APS array of the image sensor of an example embodiment.

FIG. 3 is a layout of the APS array of the image sensor according to an example embodiment.

With reference to FIG. 3, the APS array 10 of example embodiments may be constructed so that a pair of a first active region A1, including two PPDs (PD1, PD2) sharing a first FD (FD1), and a second active region A2, including two PPDs (PD3, PD4) sharing a second FD (FD2), are arranged as a repeating unit in a matrix form. Additionally, the APS array 10 of example embodiments may be constructed so that a third active region A3 and a fourth active region A4, as two independent reading element regions, are provided with every pair of the first active region A1 and the second active region A2. That is, the first to fourth active regions A1, A2, A3, A4 may constitute the unit of the 4-shared pixel structure.

The first active region A1 may be an active region, for example, in the form of one-axis-merged dual lobes, and the second active region A2 may be an active region, for example, in the form of no-axis-merged dual lobes.

For example, the first active region A1 may be formed by merging dual-lobe-type active regions a to a one-axis active region b via a connection active region c. The dual-lobe-type active regions a may be aligned to face each other in a column direction while positioning the axis active region b between them. Thus, the one-axis-merged, dual-lobe-type active region may have an outer appearance substantially similar to the hypocotyl of a young dicotyledon and the dual cotyledons branching at the hypocotyl. The dual-lobe-type active regions a may include two PPDs (PD1, PD2), and the connection active region c may be the first FD (FD1).

The second active region A2 may be formed by merging the dual-lobe-type active regions a with each other via the connection active region c, without the axis. The dual-lobe-type active regions a may be aligned to face each other in the column direction. Therefore, the no-axis-merged, dual-lobe-type active region may have an outer appearance substantially similar to the dual cotyledons of a young dicotyledon. The dual-lobe-type active regions a may include two PPDs (PD3, PD4), and the connection active region c may be the second FD (FD2).

In addition, a reset gate RG may be arranged to the one-axis active region b to form the reset element, which is favorable in the interest of efficiency of wires. Further, since the reset element functions to reset the FD (such resets may or may not be periodic), a single junction of the FD and the reset element is preferable in terms of the minimization of wires. However, the element provided to the one-axis active region b is not limited to the reset element. In order to repeat the array, a dummy gate DG having substantially the same shape as the reset gate RG may be provided adjacent to the connection of the second active region A2.

The third active region A3 and the fourth active region A4 each may have a reading element. In the case where the reset element is formed to the one-axis active region b, the drive element and the select element may be formed to the third active region A3 and the fourth active region A4, respectively. Accordingly, the source follower gate (SFG) of the drive element and the select gate (RSG) of the select element may be disposed in the third active region A3 and the fourth active region A4, respectively. Alternatively, depending on how the wires are formed, the select element and the drive element may be formed in the third active region A3 and the fourth active region A4, respectively.

Figure 4:
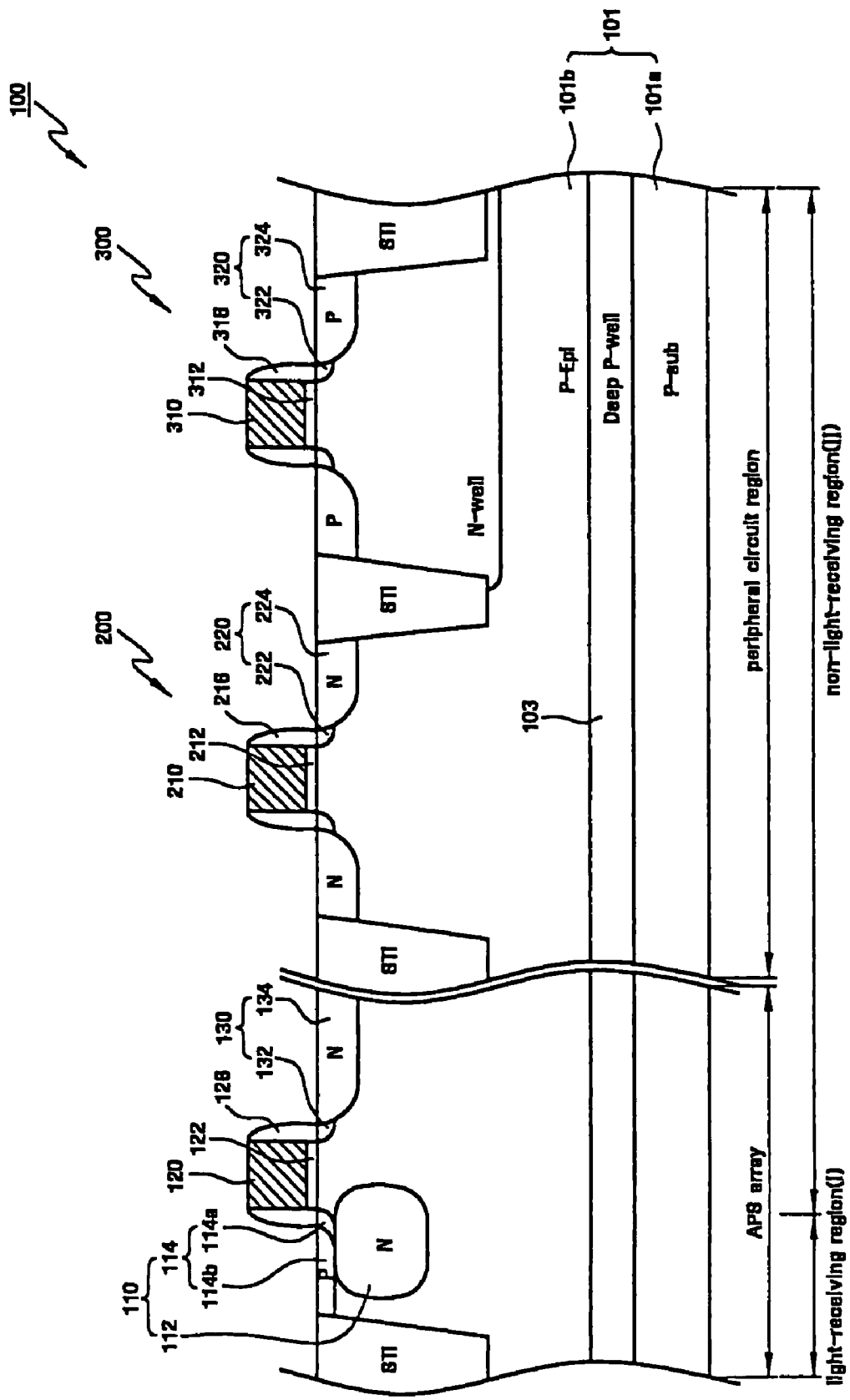
FIG. 4 is a cross-sectional view showing the image sensor formed according to the block diagram, the circuit diagram, and the layout of FIGS. 1 to 3.

FIG. 4 is a cross-sectional view showing the image sensor formed according to the block diagram, the circuit diagram, and the layout of FIGS. 1 to 3.

With reference to FIG. 4, the substrate 101 of an image sensor 100 may have a light-receiving region I and/or a non-light-receiving region II defined therein. As such, the light-receiving region I may be the region where a light-receiving element is formed, and the non-light-receiving region II may be the region where no light-receiving element is formed. For example, in the case where the layout of FIG. 3 is applied, of the APS array 10, the dual-lobe-type active regions a of the first and second active regions A1, A2 may be provided to the light-receiving region I, and the one-axis active region b and the connection active region c of the first and second active regions A1, A2 and the third and fourth active regions A3, A4 may be provided to the non-light-receiving region II.

In example embodiments, the light-receiving element provided to the light-receiving region I may be exemplified by a PPD 110 for reducing dark current and noise caused thereby. Further, the APS array 10 in the non-light-receiving region II may include the charge-transfer elements 15a, 15b, 15c, 15d (i.e., FIG. 2), the FD 130, the drive element 17 (i.e., FIG. 2), the reset element 18 (i.e., FIG. 2), and/or the select element 19 (i.e., FIG. 2). In addition, the peripheral circuit region in the non-light-receiving region II may include a plurality of NMOS transistors 200 and PMOS transistors 300, a resistor, and/or a capacitor. Thus, the peripheral circuit region may constitute a logic circuit.

In example embodiments, the substrate 101 may have a p-type bulk substrate 101a and/or a p-type epi layer 101b formed thereon.

Further, the substrate 101 may include a p-type well 103 formed therein. The p-type well 103, which is spaced apart from the surface of the substrate 101, is represented by a p-type dopant layer formed in the p-type epi layer 101b. The p-type well 103 forms a potential barrier for preventing the flow of charges produced from the deep portion of the substrate 101 into the light-receiving elements and increases the recombination of the charges and holes and, thus, acts as an electrical crosstalk barrier for reducing crosstalk between the pixels due to random drift of the charges.

The p-type well 103 may have a maximum concentration at a depth, for example, greater than or equal to about 3 μm and less than or equal to about 12 μm from the surface of the substrate 101. The p-type well 103 may have a layer thickness greater than or equal to about 1 μm and less than or equal to about 5 μm. As such, greater than or equal to about 3 μm and less than or equal to about 12 μm substantially corresponds to the absorption wavelength of infrared or near infrared rays in silicon. When the p-type well 103 is formed close to the surface of the substrate 101, the diffusion of the charges into the light-receiving elements may be prevented, thus decreasing crosstalk. However, since the region corresponding to the PPD 110 also may be formed close to the surface, sensitivity to incident light having a long wavelength (i.e., red wavelength) exhibiting relatively high photoconversion efficiency in the deep portion of the substrate may be decreased. Therefore, the position at which the p-type well 103 is formed may be adjusted depending on the wavelength of incident light, if necessary.

In this way, although the case in which the p-type epi layer 101b is grown on the p-type bulk substrate 101a and the p-type well 103 is formed in the p-type epi layer 101b is described, example embodiments include other combinations. For example, the substrate 101 having various combinations as shown in Table 1 below may be used in the fabrication of the image sensor.

TABLE 1

| Bulk Substrate | P-type Well | Epi Layer |
|---|---|---|
| P-type | x | x |
| P-type | ☐ | x |
| P-type | x | P-type |
| P-type | ☐ | P-type |
| N-type | x | x |
| N-type | ☐ | x |
| N-type | x | P-type |
| N-type | x | N-type |
| N-type | ☐ | P-type |
| N-type | ☐ | N-type |
| N-type | ☐ | x (formation of p-type well, not in epi layer, but in n-type bulk substrate) |

In addition to the semiconductor substrates listed in Table 1, an organic plastic substrate also may be used.

On such a substrate 101, a plurality of gates 120, 210, 310 may be disposed. For example, a transfer gate 120, a reset gate, and/or a drive gate may be provided to the APS array 10, while gates 210, 310 of NMOS and PMOS transistors 200, 300 may be provided to the peripheral circuit region. In addition, spacers 126, 216, 316 may be formed on both side walls of the gates 120, 210, 310. Substrate 101 also may include, for example, a plurality of shallow trench isolations STI.

The gates 120, 210, 310 may be formed, for example, of a conductive polysilicon film, a metal film (such as, for example, W, Pt, or Al), a metal nitride film (such as, for example, TiN), a metal silicide film obtained from refractory metal (such as, for example, Co, Ni, Ti, Hf, or Pt), or combinations thereof. In addition, the gates 120, 210, 310 may be formed by sequentially superimposing the conductive poly-silicon film and the metal silicide film, or sequentially superimposing the conductive polysilicon film and the metal film, but example embodiments include other formations. The spacers 126, 216, 316 may be formed, for example, of a nitride film (such as, for example, SiN).

The PPD 110, which is disposed at one side of the transfer gate 120, includes a first conductivity type, for example, an n-type first dopant region 112 of the PPD 110 formed in the substrate 101, and a second conductivity type, different from the first conductivity type, for example, a p-type second dopant region 114 of the PPD 110 may be formed on the surface of the substrate 101.

Herein, the n-type first dopant region 112 of the PPD 110 may function to absorb incident light so as to accumulate the charge corresponding to the amount of light, while the p-type second dopant region 114 of the PPD 110 may function to decrease a thermally generated EHP (Electron-Hole Pair) so as to prevent the generation of dark current. For example, the dark current may occur as a result of damage to the surface of the substrate, such damage possibly being caused by dangling silicon bonds or etching stress during the formation of the gates 120 or spacers 126. Hence, the n-type first dopant region 112 of the PPD 110 may be formed deep in the substrate 101, whereas the p-type second dopant region 114 of the PPD 110 may be formed on the surface of the substrate. Thereby, among the thermally generated EHPs of the surface, the holes are diffused into the ground substrate via the p-type second dopant region 114, and the electrons are recombined with the holes in the course of diffusing such electrons into the p-type second dopant region 114, and are then eliminated.

However, the p-type second dopant region 114 of the PPD 110 may include a lower-concentration dopant region 114a formed to be aligned to the transfer gate 120 and a higher-concentration dopant region 114b formed to be aligned to the spacer 126 formed at the side wall of the transfer gate 120. As such, the formation depth of the lower-concentration dopant region 114a and the higher-concentration dopant region 114b may be substantially the same, and the lower-concentration dopant region 114a may have a concentration that is about one half that of the higher-concentration dopant region 114b.

The reason why the p-type second dopant region 114 of the PPD 110 includes the lower-concentration dopant region 114a and the higher-concentration dopant region 114b is that no additional mask is used in the formation of the p-type second dopant region 114 of the PPD 110. That is, using the plurality of gates as a mask, the p-type dopant is primarily ion-implanted into the entire surface of the substrate 101, and the spacers are formed. Subsequently, using the plurality of gates having the spacers as a mask, the p-type dopant is secondarily ion-implanted into the entire surface of the substrate 101, thus completing the p-type second dopant region 114 of the PPD 110. The description thereof is given below with reference to FIGS. 5A to 5I.

Further, blue light, green light, and red light (respectively) have absorption wavelengths in the substrate 101 greater than or equal to about 0.05 μm and less than or equal to about 0.4 μm, greater than or equal to about 0.15 μm and less than or equal to about 1.5 μm, and greater than or equal to about 0.4 μm and less than or equal to about 5 μm. Thus, the n-type first dopant region 112 of the PPD 110 may be greater than or equal to about 2 μm in depth. Moreover, in order to capture almost all of the absorbed red light to realize high sensitivity, the n-type first dopant region 112 of the PPD 110 may be greater than or equal to about 5 μm in depth.

In addition, part of the n-type first dopant region 112 of the PPD 110 may be formed to overlap the transfer gate 120. The charge accumulated in the n-type first dopant region 112 of the PPD 110 may be transferred to the FD 130 via the lower channel region of the transfer gate 120. As such, since the n-type first dopant region 112 of the PPD 110 is typically formed deeper than the channel region, the charge accumulated in the n-type first dopant region 112 of the PPD 110 should transfer vertically upward by a distance (that may or may not be predetermined) to reach the channel region. However, if part of the n-type first dopant region 112 of the PPD 110 overlaps the transfer gate 120, the transfer distance of the charge is decreased and thus the charge may be transferred to the FD 130 within a short time.

Further, the FD 130 disposed in the substrate 101, at the other side of the transfer gate 120, may have a LDD (Low Doped Drain) structure. In such a case, the FD 130 may include a lower-concentration dopant region 132 of the LDD formed to be aligned to the transfer gate 120 and/or a higher-concentration dopant region 134 of the LDD formed to be aligned to the spacer 126.

The source and/or drain regions 220, 320 of the NMOS and PMOS transistors 200, 300 provided to the peripheral circuit region in the non-light-receiving region II may have a LDD structure. In such a case, the source and/or drain regions 220, 320 of the NMOS and PMOS transistors 200, 300 may respectively have lower-concentration dopant regions 222, 322 of the LDD and higher-concentration dopant regions 224, 324 of the LDD.

However, the source and/or drain regions 220 of the NMOS transistor 200 include both n-type and p-type dopants, the n-type dopant having the concentration higher than the p-type dopant. Upon the formation of the p-type second dopant region 114 of the PPD 110, since the p-type dopant is ion-implanted into the entire surface of the substrate 101, the p-type dopant may also be ion-implanted into the source and/or drain regions 220 of the NMOS transistor 200 provided to the peripheral circuit region.

Turning now to FIGS. 5A to 5I, cross-sectional views showing the process of fabricating the image sensor according to an example embodiment are illustrated.

As shown in FIG. 5A, the substrate 101 having the p-type bulk substrate 101a and the p-type epi layer 101b formed thereon is provided.

Subsequently, a p-type dopant is ion-implanted into the substrate 101 to form the p-type well 103. The p-type well 103 may have a maximum concentration at a depth, for example, greater than or equal to about 3 μm and less than or equal to about 12 μm from the surface of the substrate 101. The p-type well 103 may have a layer thickness greater than or equal to about 1 μm and less than or equal to about 5 μm.

On the substrate 101, an insulating film, a gate conductive film, and/or an insulating film for a hard mask may be sequentially deposited and patterned, thus forming gate insulating films 122, 212, 312, gates 120, 210, 310, and hard mask patterns 140, 230, 330 in the non-light-receiving region II.

For example, the gate insulating films 122, 212, 312 may be formed, for example, of $SiO_2$, SiON, SiN, $Al_2O_3$, $Si_3N_4$, $Ge_xO_yN_z$ (0<x<1, 0<y<1, 0<z<1, x+y+z), $Ge_xSi_yO_z$ (0<x<1, 0<y<1, 0<z<1, x+y+z=1), or other high-k material(s). As such, the high-k material, such as $HfO_2$, $ZrO_2$, $Al_2O_3$, $Ta_2O_5$, hafnium silicate, zirconium silicate, or combinations thereof, may be subjected to atomic layer deposition to form a film. Further, the gate insulating films 122, 212, 312 may be formed by superimposing two or more materials selected from among the above-listed materials into a plurality of layers. The gate insulating films 122, 212, 312 may have a thickness greater than or equal to about 5 Å and less than or equal to about 100 Å.

The plurality of gates 120, 210, 310 may be composed of a conductive polysilicon film, a metal film (such as, for example, W, Pt, or Al), a metal nitride film (such as, for example, TiN), a metal silicide film obtained from refractory metal (such as, for example, Co, Ni, Ti, Hf, or Pt), or combinations thereof In addition, the gates 120, 210, 310 may be formed by sequentially superimposing the conductive polysilicon film and the metal silicide film or sequentially superimposing the conductive polysilicon film and the metal film, but example embodiments include other formations.

The hard mask patterns 140, 230, 330 may be formed, for example, of SiN and/or SiON.

As shown in FIG. 5B, on the substrate 101 having the gates 120, 210, 310 formed thereon, a photoresist pattern 191 in which the light-receiving region I is opened is formed, and a first conductivity type, for example, an n-type dopant 161, is ion-implanted, thus forming the n-type first dopant region 112 of the PPD 110.

For example, the n-type first dopant region 112 of the PPD 110 may be formed, for example, with a depth greater than or equal to about 2 μm so as to efficiently absorb blue light, green light, and/or red light. Further, the n-type first dopant region 112 of the PPD 110 may be formed, for example, with a depth greater than or equal to about 5 μm in order to capture almost all of the red light, so as to increase the sensitivity to the red light.

The n-type first dopant region 112 of the PPD 110 may be formed by ion-implanting the n-type dopant 161 (i.e., As) using energy, for example, greater than or equal to about 100 keV and less than or equal to about 500 keV at a dose, for example, greater than or equal to about $1 \times 10^{12}$ ions/cm² and less than or equal to about $1 \times 10^{14}$ ions/cm². As well, the n-type dopant 161 may be ion-implanted, for example, at an angle. For example, the n-type dopant 161 may be ion-implanted at an angle greater than 0° and less than or equal to about 15° from perpendicular to the surface of the substrate (the angle may or may not be predetermined), so that part of the n-type first dopant region 112 of the PPD 110 may be formed so as to overlap the transfer gate 120.

As shown in FIG. 5C, the photoresist pattern 191 (i.e., FIG. 5B) may be removed, and the hard mask patterns 140, 230, 330 (i.e., FIG. 5B) may be removed.

For example, since the n-type first dopant region 112 of the PPD 110 may be formed through ion implantation at an angle using high energy (the angle may or may not be predetermined), the n-type dopant 161 (i.e., FIG. 5B) may be unintentionally ion-implanted into the lower channel region of the transfer gate 120. In order to prevent such a phenomenon, the hard mask pattern 140 on the transfer gate 120 may be removed after the formation of the n-type first dopant region 112 of the PPD 110.

Subsequently, the substrate 101 may be thermally oxidized. The thermal oxidation process is called GPOX (Gate Poly OXidation).

Although not shown in the drawings, when the substrate 101 is thermally oxidized, the gate insulating films 122, 212, 312 beneath the gates 120, 210, 310 may be thickened at both edges thereof, thus having a bird's-beak form. Thereby, upon the operation of the transistor, the two edges beneath the gates 120, 210, 310 have a decreased field and, thus, reliability of the gate insulating films 122, 212, 312 is not deteriorated. Further, upon the formation of the gates 120, 210, 310, the reliability thereof may be increased thanks to the curing of etching damage.

As shown in FIG. 5D, no additional mask is deposited, and the plurality of gates is used as a mask, whereby the second conductivity type dopant, different from the first conductivity type dopant, for example, a p-type dopant 162, is primarily ion-implanted into the entire surface of the substrate 101.

For example, the p-type dopant 162 may be ion-implanted using energy, for example, greater than or equal to about 5 keV and less than or equal to about 20 keV in the case of B (greater than or equal to about 20 keV and less than or equal to about 100 keV in the case of $BF_2$) at a dose, for example, greater than or equal to about $5\times10^{12}$ ions/cm$^2$ and less than or equal to about $5\times10^{13}$ ions/cm$^2$. The energy may or may not be predetermined.

However, since the p-type dopant 162 is ion-implanted over the entire surface of the substrate 101, it may also be provided to the source and/or drain regions 220, 320 (i.e., FIG. 4) of the NMOS transistors 200 and the PMOS transistors 300 to be formed in the non-light-receiving region II (see 226, 326). Thus, when the p-type dopant 162 is ion-implanted at a large angle, the NMOS and PMOS transistors 200, 300 to be formed in the non-light-receiving region II may undesirably operate asymmetrically. As a result, the p-type dopant 162 may be ion-implanted, for example, substantially perpendicular to the surface of the substrate. Also, the p-type dopant 162 may be ion-implanted at an angle which does not cause such asymmetrical operation, for example, greater than or equal to 0° and less than or equal to about 3° from perpendicular to the surface of the substrate (the angle may or may not be predetermined).

Figure 5E:
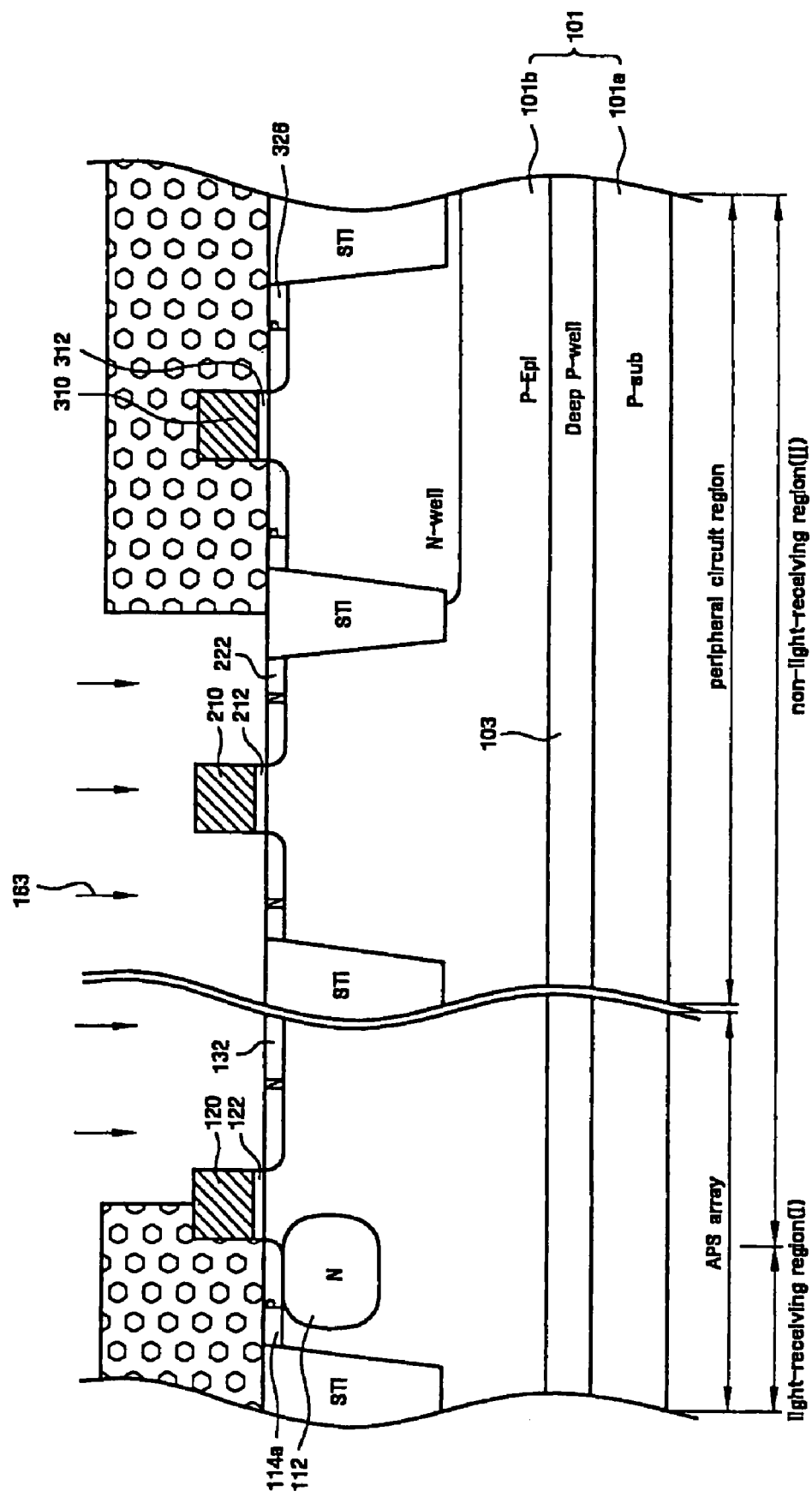

As shown in FIGS. 5E and 5F, in the non-light-receiving region II, an n-type dopant 163 may be ion-implanted into the NMOS transistor 200 and a p-type dopant 164 may be ion-implanted into the PMOS transistor 300, thus forming lower-concentration dopant regions 132, 222, 322 of the LDD aligned to the gates 120, 210, 310.

For example, upon the formation of the lower-concentration dopant regions 132, 222, 322 of the LDD, the n-type and/or p-type dopants 163, 164 maybe used in doses suitable for compensating for the p-type dopant 162 through the primary ion implantation in FIG. 5D. In example embodiments, "compensation for a p-type dopant" means the removal of the effect of the previously ion-implanted p-type dopant 162 by controlling the doses of the n-type and/or p-type dopants 163, 164 to be subsequently ion-implanted, in consideration of the dose of the previously ion-implanted p-type dopant 162 (i.e., FIG. 5D). For example, such a dopant may be ion-implanted into the FD 130 and/or the lower-concentration dopant regions 132, 222 of the LDD of the NMOS transistor 200 in a larger dose, for example, greater than or equal to about $1.5\times10^{13}$ ions/cm$^2$ and less than or equal to about $5.5\times10^{14}$ ions/cm$^2$. Further, the dopant may be ion-implanted into the lower-concentration dopant region 322 of the LDD of the PMOS transistor 300 in a smaller dose, for example, greater than or equal to about $5\times10^{12\ ions/cm2}$ and less than or equal to about $4.5\times10^{14}$ ions/cm$^2$.

Moreover, since only the lower-concentration dopant regions 132, 222, 322 of the LDD need to be formed before the formation of the spacers, the above process sequence may be reversed in comparison with the process of FIG. 5D.

As shown in FIG. 5G, spacers 126, 216, 316 may be formed on both side walls of the plurality of gates 120, 210, 310. Subsequently, using the plurality of gates 120, 210, 310 having the spacers 126, 216, 316 as a mask, without the deposition of an additional mask, a second conductivity type dopant, for example, a p-type dopant 165, may be secondarily ion-implanted into the entire surface of the substrate 101, thus completing the p-type second dopant region 114 of the PPD 110.

For example, the secondary ion implantation may be conducted using substantially the same energy and/or substantially the same dose as in the primary ion implantation of FIG. 5D. For example, the p-type dopant 165 may be ion-implanted using energy, for example, greater than or equal to about 5 keV and less than or equal to about 20 keV in the case of B (greater than or equal to about 20 keV and less than or equal to about 100 keV in the case of $BF_2$) at a dose, for example, greater than or equal to about $5\times10^{12}$ ions/cm$^2$ and less than or equal to about $5\times10^{13}$ ions/cm$^2$. The energy may or may not be predetermined. However, the energies and/or doses may be different. For example, the ratio of energies may be approximately 10:1, 5:1, 4:1, 3:1, 2:1, 1.5:1, 1:1, 1:1.5, 1:2, 1:3, 1:4, 1:5, or 1:10. For example, the ratio of doses may be approximately 10:1, 5:1, 4:1, 3:1, 2:1, 1.5:1, 1:1, 1:1.5, 1:2, 1:3, 1:4, 1:5, or 1:10. In an example embodiment, the ratio of doses may be approximately 7:3 or 3:7.

The p-type second dopant region 114 of the PPD 110 may include a lower-concentration dopant region 114a, in which the p-type dopant 162 (i.e., FIG. 5D) is ion-implanted only upon the primary ion implantation, and/or a higher-concentration dopant region 114b, in which the p-type dopants 162, 165 are ion-implanted upon both the primary and secondary ion implantations. However, as mentioned above, in the case where the primary and secondary ion implantations are conducted using the same energy and doses, the lower-concentration dopant region 114a may be formed as deep as the higher-concentration dopant region 114b. As such, the lower-concentration dopant region 114a may have a concentration about one half that of the higher-concentration dopant region 114b.

Figure 5I:
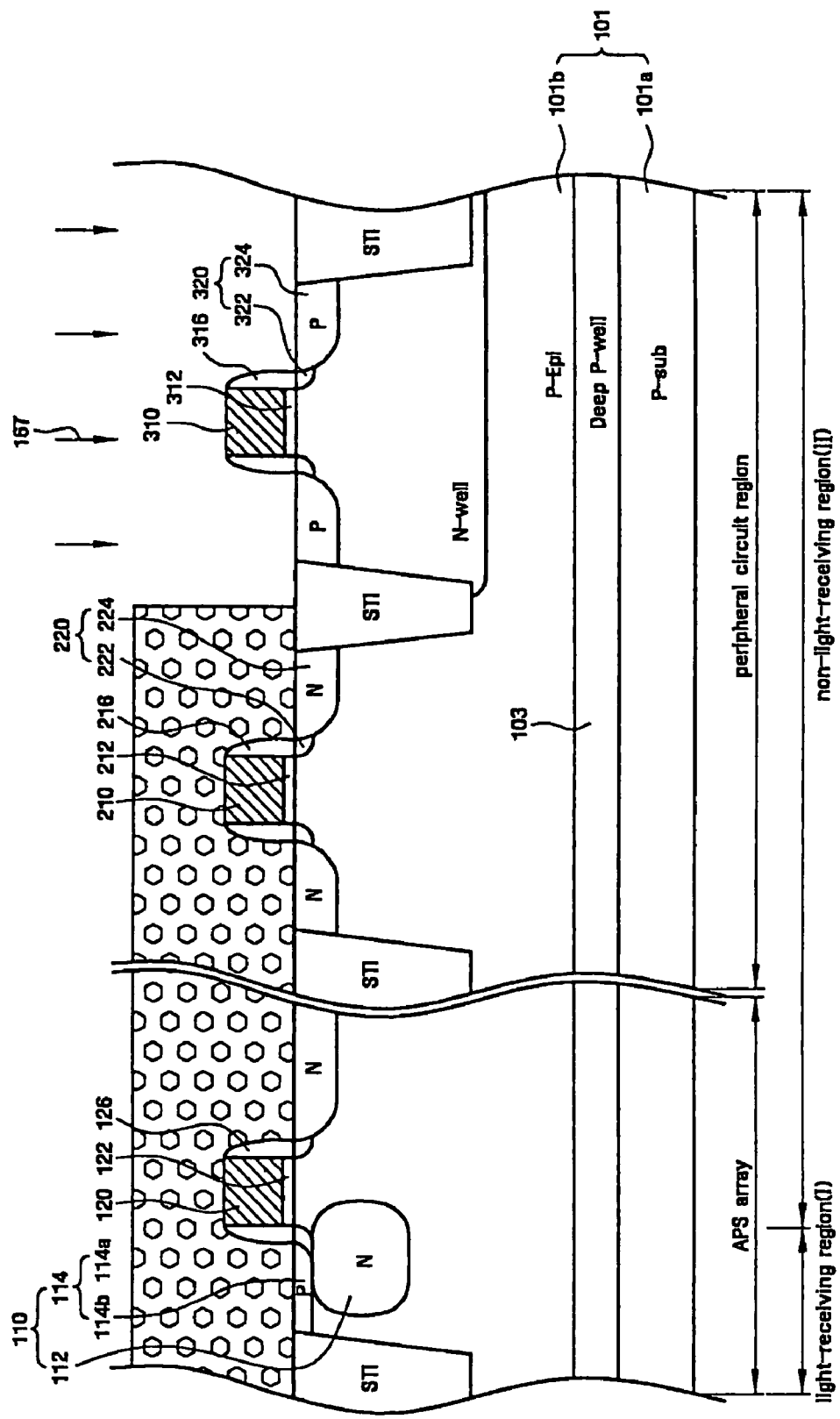

As shown in FIGS. 5H and 5I, an n-type dopant 166 may be ion-implanted into the NMOS transistor 200 in the non-light-receiving region II, and/or a p-type dopant 167 may be ion-implanted into the PMOS transistor 300, thus forming higher-concentration dopant regions 134, 224, 324 of the LDD respectively aligned to the spacers 126, 216, 316. For example, the doses of the n-type and p-type dopants 166, 167, which are used to form the higher-concentration dopant regions 134, 224, 324 of the LDD, may be suitable for the compensation of the p-type dopant 165 through the primary ion implantation in FIG. 5G.

Alternatively, since only the higher-concentration dopant regions 134, 224, 324 of the LDD need to be formed after the formation of spacers 126, 216, 316, the above process sequence may be reversed compared to the process of FIG. 5G.

Thereafter, according to process steps widely known to those skilled in the semiconductor device art, steps of forming wires to input and/or output the electric signal to and/or from the transistor, forming a passivation layer on the substrate, and/or packaging the substrate are further carried out, thereby completing the image sensor.

As such, with reference to FIGS. 4, 6A and 6B, the reason why the p-type dopants may be respectively ion-implanted before and after the formation of the spacers 126, 216, 316 to form the p-type second dopant region 114 of the PPD 110 is described below.

Figure 6A:
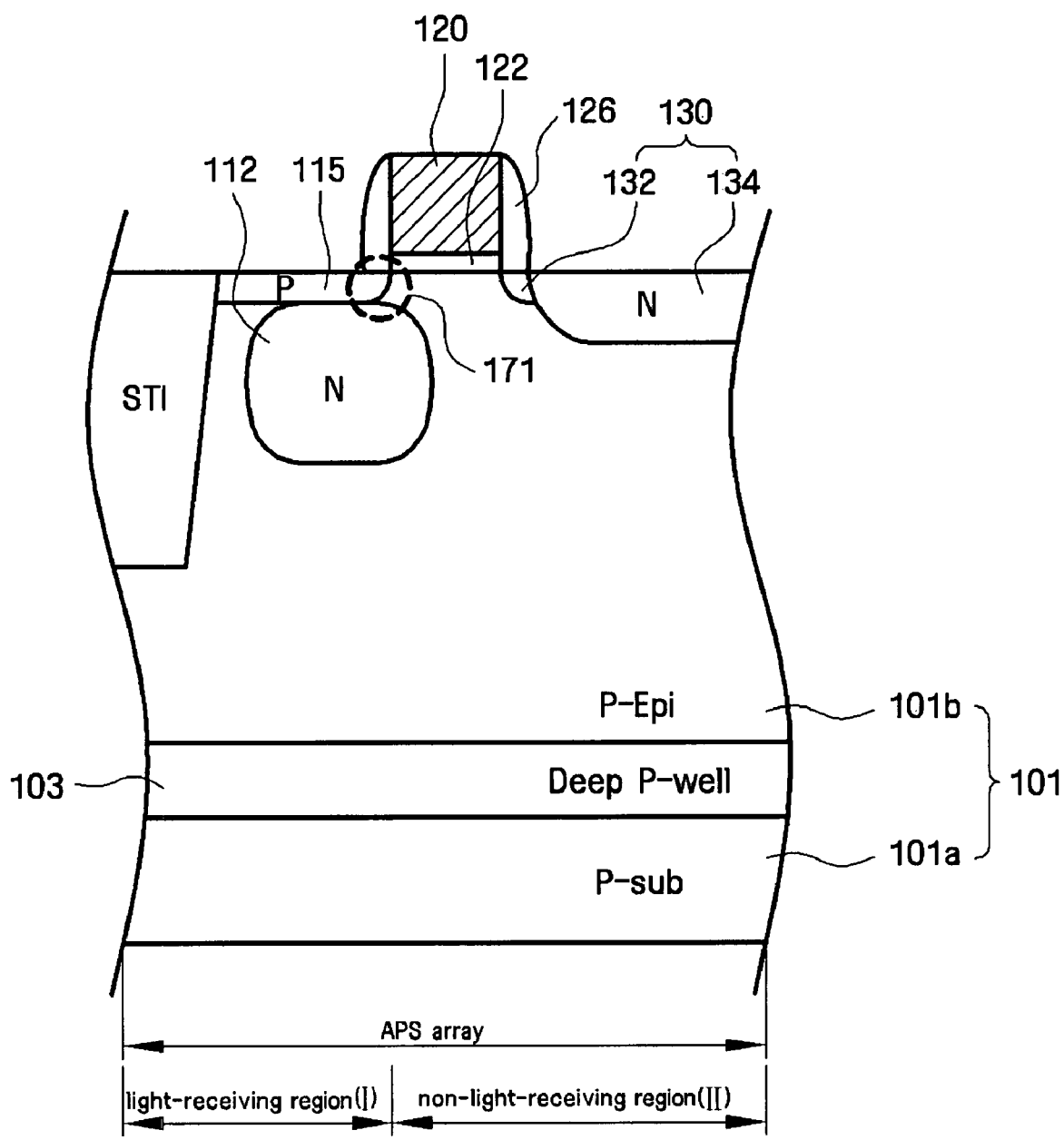
FIGS. 6A and 6B are views schematically showing the process of fabricating the image sensor according to an example embodiment.

As shown in FIG. 6A, in the case where a second dopant region 115 of the PPD 110 may be formed through a single ion implantation before the formation of the spacer 126 without the use of an additional mask, the second dopant region 115 of the PPD 110 may be formed to be aligned to the transfer gate 120. In such a case, the second dopant region 115 of the PPD 110 may be formed to come into contact with the transfer gate 120 (see 171) and, thus, the charge which is transferred through the lower channel region of the transfer gate 120 may not be efficiently transferred to the FD 130 due to the influence of the second dopant region 115 of the PPD 110. Ultimately, image lag and noise caused thereby may occur.

Figure 6B:
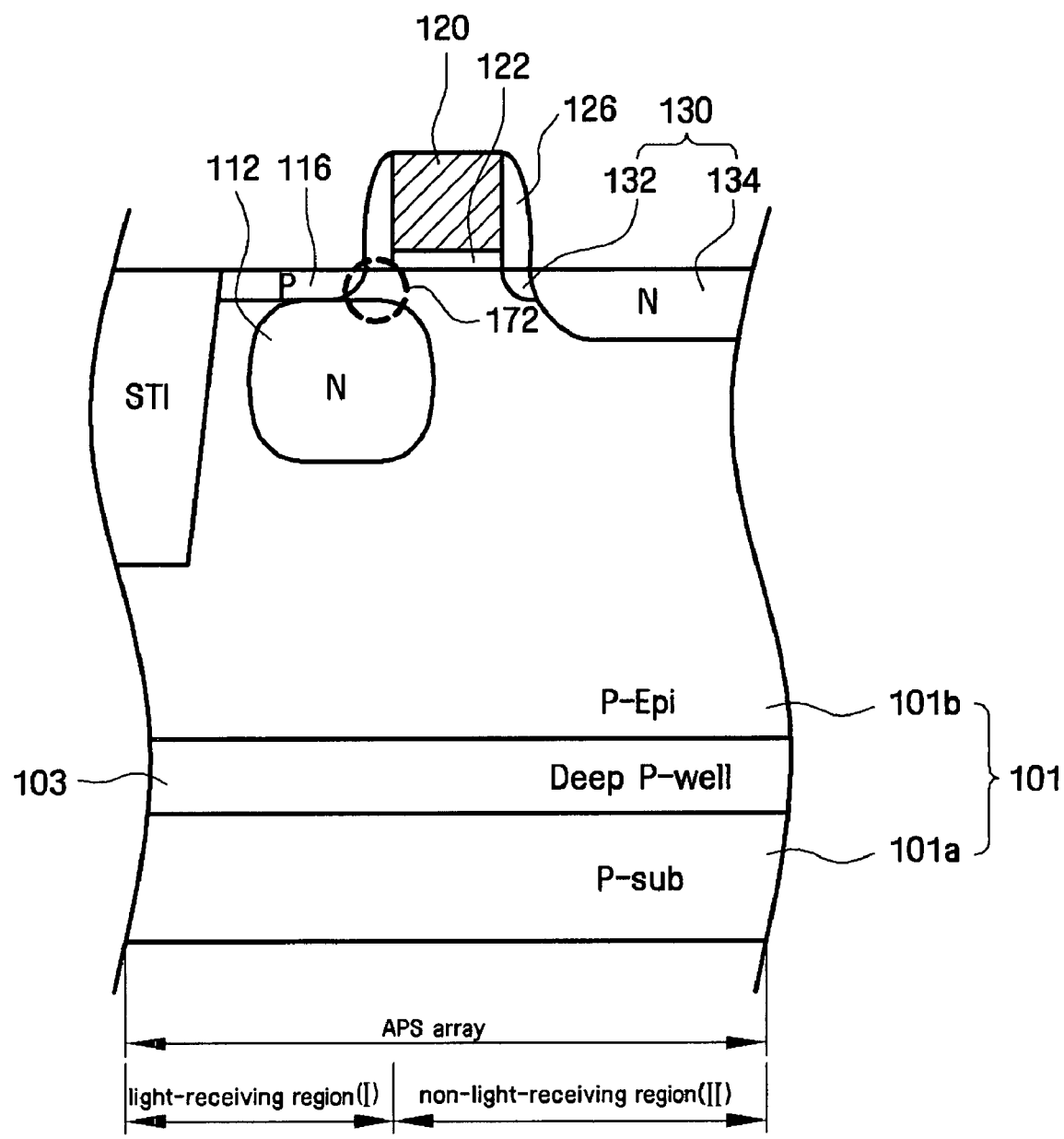

Further, as shown in FIG. 6B, in the case where a second dopant region 116 of the PPD 110 may be formed through a single ion implantation after the formation of the spacer 126 without the use of an additional mask, the second dopant region 116 of the PPD 110 may be formed to be aligned to the spacer 126. In such a case, since the second dopant region 116 of the PPD 110 is not formed under the spacer 126 (see 172), it may be impractical or impossible to prevent dark current from occurring on the surface of the substrate 101.

Accordingly, as shown in FIG. 4, in example embodiments, the lower-concentration dopant region 114a, which may be aligned to the transfer gate 120 and also extends to the portion beneath the spacer 126, is formed, and may be formed in a concentration range within which it is possible to minimize the generation of dark current on the surface of the substrate 101 without causing image lag.

Figure 7:
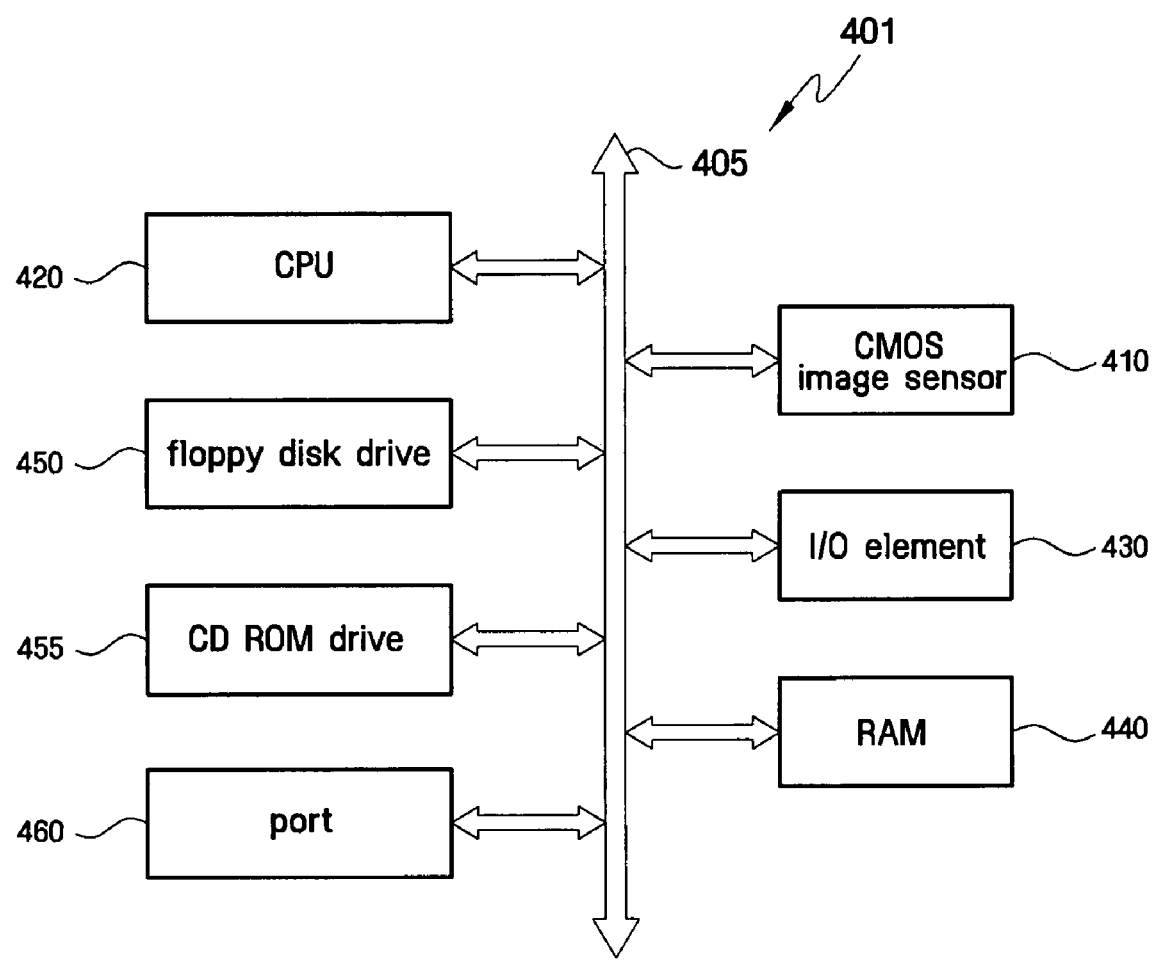
FIG. 7 is a schematic view showing a processor-based system including the image sensor according to an example embodiment.

FIG. 7 is a schematic view showing a processor-based system including the image sensor of an example embodiment.

As shown in FIG. 7, the processor-based system 401 is a system processing the output image of an image sensor 410. Examples of the processor-based system 401 may include, but are not limited to, a computer system, a camera system, a scanner, a mechanized clock system, a navigation system, a video phone, a director system, an auto-focus system, a tracer system, an operation monitoring system, and an image stabilization system.

The processor-based system 401, such as the computer system, includes a central processing unit (CPU) 420, such as a microprocessor, capable of communicating with an I/O element 430 via a bus 405. The image sensor 410 may communicate with the system via the bus 405 or other communication links. In addition, the processor-based system 401 may further include random access memory (RAM) 440, a floppy disk drive 450 and/or a compact disc (CD) read-only memory (ROM) drive 455, and a port 460, each capable of communicating with the CPU 420 via the bus 405. The port 460 may be a port that is able to be coupled with a video card, a sound card, a memory card or a universal serial bus (USB) element, or that is able to communicate with another system to provide data. The image sensor 410 may be integrated together with the CPU 420, a digital signal processor (DSP) or a microprocessor, and also, may be further integrated with memory. Alternatively, the image sensor may be integrated on a chip other than the processor, if necessary.

Although the image sensor of example embodiments may be characterized by having the 4-shared pixel structure in which four PPDs 110 share the reading element with one another, a 2-shared pixel structure or an unshared pixel structure, which are known to those skilled in the art, may be applied.

According to the image sensor fabrication method and the image sensor fabricated using the same, the number of masks may be decreased.

While example embodiments have been particularly shown and described, it will be understood by those of ordinary skill in the art that various changes in form and details may be made therein without departing from the spirit and scope of the present invention as defined by the following claims.

What is claimed is:

1. A method of fabricating an image sensor, comprising:
providing a substrate including a light-receiving region and a non-light-receiving region;
forming a plurality of gates on the non-light-receiving region;
ion-implanting a first-conductivity-type dopant into the light-receiving region to form a first dopant region of a pinned photodiode;
primarily ion-implanting a second-conductivity-type dopant, different from the first-conductivity-type dopant, into an entire surface of the substrate, using the plurality of gates as a first mask;
masking the light-receiving region a first time;
ion-implanting the first-conductivity-type dopant and the second-conductivity-type dopant into the non-light-receiving region to form lower-concentration dopant regions of low doped drains aligned to the plurality of gates before forming spacers on both side walls of the plurality of gates;
unmasking the light-receiving region the first time;
forming the spacers on both side walls of the plurality of gates; and
secondarily ion-implanting the second-conductivity-type dopant into the entire surface of the substrate, using the plurality of gates including the spacers as a second mask, to complete a second dopant region of the pinned photodiode;
masking the light-receiving region a second time;
ion-implanting the first-conductivity-type dopant and the second-conductivity-type dopant into the non-light-receiving region to form higher-concentration dopant regions of the low doped drains aligned to the spacers after forming the spacers on both side walls of the plurality of gates; and
unmasking the light-receiving region the second time.

2. The method of claim 1, wherein the second-conductivity-type dopant is primarily ion-implanted substantially perpendicular to the surface of the substrate, and
wherein the second-conductivity-type dopant is secondarily ion-implanted substantially perpendicular to the surface of the substrate.

3. The method of claim 1, wherein the second-conductivity-type dopant is primarily ion-implanted and secondarily ion-implanted in about a same dose.

4. The method of claim 1, wherein the second-conductivity-type dopant is primarily ion-implanted and secondarily ion-implanted using about a same amount of energy.

5. The method of claim 1, wherein forming of the plurality of gates comprises forming a transfer gate, and
wherein the forming of the first dopant region includes ion-implanting the first-conductivity-type dopant at an angle so that part of the first dopant region overlaps the transfer gate.

6. The method of claim 1, wherein forming of the plurality of gates comprises:
forming a gate conductive film and a hard mask pattern on the substrate; and
patterning the gate conductive film using the hard mask pattern as a third mask to form the plurality of gates.

7. The method of claim 6, further comprising:
removing the hard mask pattern after forming the first dopant region.

8. The method of claim 7, further comprising:
thermally oxidizing the substrate between removing the hard mask pattern and the primarily ion-implanting of the second-conductivity-type dopant.

9. The method of claim 1, wherein the first-conductivity-type dopant and the second-conductivity-type dopant, that are ion-implanted to form the lower-concentration dopant regions of the low doped drains, are used in doses suitable for compensating for the second-conductivity-type dopant through the primary ion implantation.

10. The method of claim 1, wherein the first-conductivity-type dopant and the second-conductivity-type dopant, that are ion-implanted to form the higher-concentration dopant regions of the low doped drains, are used in doses suitable for compensating for the second-conductivity-type dopant through the secondary ion implantation.

11. The method of claim 1, further comprising:
forming a gate conductive film and a hard mask pattern on the substrate, and patterning the conductive film using the hard mask pattern as a third mask to form the plurality of gates;
removing the hard mask pattern; and
thermally oxidizing the substrate.

12. The method of claim 11, wherein the first-conductivity-type dopant and the second-conductivity-type dopant, that are ion-implanted to form the lower-concentration dopant regions of the low doped drains, are used in doses suitable for compensating for the second-conductivity-type dopant through the primary ion implantation.

13. The method of claim 11, wherein the first-conductivity-type dopant and the second-conductivity-type dopant, that are ion-implanted to form the higher-concentration dopant regions of the low doped drains, are used in doses suitable for compensating for the second-conductivity-type dopant through the secondary ion implantation.

* * * * *